United States Patent
Yang et al.

(10) Patent No.: US 10,432,357 B2
(45) Date of Patent: *Oct. 1, 2019

(54) SEQUENCE-BASED POLAR CODE DESCRIPTION

(71) Applicant: QUALCOMM Incorporated, San Diego, CA (US)

(72) Inventors: Yang Yang, San Diego, CA (US); Jing Jiang, San Diego, CA (US); Gabi Sarkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/818,393

(22) Filed: Nov. 20, 2017

(65) Prior Publication Data

US 2018/0351695 A1 Dec. 6, 2018

Related U.S. Application Data

(60) Provisional application No. 62/514,613, filed on Jun. 2, 2017.

(51) Int. Cl.
*H03M 13/00* (2006.01)
*H04L 1/00* (2006.01)
(Continued)

(52) U.S. Cl.
CPC .......... *H04L 1/0058* (2013.01); *H03M 13/13* (2013.01); *H03M 13/3944* (2013.01);
(Continued)

(58) Field of Classification Search
None
See application file for complete search history.

(56) References Cited

U.S. PATENT DOCUMENTS

| 10,135,460 B2 | 11/2018 | Ionita et al. |
| 2013/0117344 A1* | 5/2013 | Gross ...................... G06F 17/10 708/490 |

(Continued)

OTHER PUBLICATIONS

Niu K., et al., "Polar Codes: Primary Concepts and Practical Decoding Algorithms", IEEE Communications Magazine, IEEE Service Center, Piscataway, US, vol. 52, No. 7, Jul. 2014, pp. 192-203, XP011553413, ISSN: 0163-6804, DOI: 10.1109/MCOM. 2014.6852102 [retrieved on Jul. 10, 2014].

(Continued)

*Primary Examiner* — Mujtaba M Chaudry
(74) *Attorney, Agent, or Firm* — Nerrie M. Zohn

(57) ABSTRACT

Methods, systems, and devices that support an efficient sequence-based polar code description are described. In some cases, a wireless device (e.g., a user equipment (UE) or a base station) may transmit a codeword including a set of information bits encoded using a polar code or receive a codeword including a set of information bits encoded using a polar code. As described herein, the wireless device may determine the bit locations of the information bits in the polar code based on a partition assignment vector. Specifically, the wireless device may partition bit-channels for one or more stages of polarization and assign information bits to partitions based on the partition assignment vector. Once the bit locations of the information bits are determined, the wireless device may decode a received codeword or transmit an encoded codeword based on the determined bit locations of the information bits.

30 Claims, 10 Drawing Sheets

(51) Int. Cl.
*H03M 13/13* (2006.01)
*H03M 13/39* (2006.01)
*H04W 72/04* (2009.01)

(52) U.S. Cl.
CPC ....... *H04L 1/0045* (2013.01); *H04W 72/0466* (2013.01); *H03M 13/635* (2013.01)

(56) References Cited

U.S. PATENT DOCUMENTS

| | | | | |
|---|---|---|---|---|
| 2014/0365842 | A1* | 12/2014 | Li | H03M 13/09 714/752 |
| 2015/0016563 | A1* | 1/2015 | Mahdavifar | H04L 1/0075 375/295 |
| 2015/0026543 | A1* | 1/2015 | Li | H03M 13/13 714/776 |
| 2015/0092886 | A1* | 4/2015 | Ionita | H04L 25/4917 375/298 |
| 2015/0188666 | A1* | 7/2015 | Mahdavifar | H04L 1/0052 375/295 |
| 2015/0293716 | A1 | 10/2015 | Jiang et al. | |
| 2015/0295593 | A1* | 10/2015 | Trifonov | H03M 13/3746 714/776 |
| 2016/0013810 | A1* | 1/2016 | Gross | H03M 13/09 714/776 |
| 2017/0126354 | A1 | 5/2017 | Marsland et al. | |
| 2017/0149531 | A1* | 5/2017 | Raza | G06F 11/10 |
| 2017/0230059 | A1* | 8/2017 | Giard | H03M 13/134 |
| 2017/0366199 | A1* | 12/2017 | Ge | H03M 13/09 |
| 2017/0366204 | A1* | 12/2017 | Shi | H03M 13/134 |
| 2018/0145702 | A1 | 5/2018 | Feygin et al. | |
| 2018/0351696 | A1 | 12/2018 | Yang et al. | |

OTHER PUBLICATIONS

International Search Report and Written Opinion—PCT/US2018/025255—ISA/EPO—dated Jul. 16, 2018.

Qualcomm Incorporated: "Frank Polar Construction for NR Control Channel and Performance Comparison," 3GPP Draft; R1-1709178 Frank Polar Construction for NR Control Channel and Performance Comparison, 3rd Generation Partnership Project (3GPP), Mobile Competence Centre; 650, Route Des Lucioles; F-069, vol. RAN WG1, No. Hangzhou; May 15, 2017-May 19, 2017, May 17, 2017, XP051285058, 27 Pgaes, Retrieved from the Internet: URL: http://www.3gpp.org/ftp/tsg_ran/WG1_RL1/TSGR1_89/Docs/ [retrieved on May 17, 2017].

Qualcomm Incorporated: "Sequence Construction of Polar Codes for Control Channel," 3GPP Draft; R1-1711218 Sequence Construction of Polar Codes for Control Channel, 3rd Generation Partnership Project (3GPP), Mobile Competence Centre; 650, Route Des Lucioles; F-06921, Sophia-Antipoli, vol. RAN WG1, No. Qingdao; Jun. 27, 2017-Jun. 30, 2017, Jun. 20, 2017, XP051305804, 17 pages, Retrieved from the Internet: URL: http://www.3gpp.org/ftp/tsg_ran/WG1_RL1/TSGR1_AH/NR_AH_1706/Docs/ [retrieved on Jun. 20, 2017].

He G., et al., "β-expansion: A Theoretical Framework for Fast and Recursive Construction of Polar Codes", IEEE Global Communications Conference on Information Theory, Apr. 19, 2017, 7 Pages.

Mori R., et al., "Performance and Construction of Polar Codes on Symmetric Binary-Input Memoryless Channels", IEEE International Symposium on Information Theory, May 23, 2009, 5 Pages.

Tal I., et al., "How to Construct Polar Codes", IEEE Transactions on Information Theory, Apr. 10, 2013, pp. 1-21.

Tal I., et al., "List Decoding of Polar Codes", IEEE Transactions on Information Theory, May 31, 2012, pp. 1-11.

Trifonov P., "Efficient Design and Decoding of Polar Codes", IEEE Transactions on Communications, vol. 60, No. 11, Nov. 1, 2012, XP011473857, ISSN: 0090-6778, DOI: 10.1109/TCOMM.2012.081512.110872, pp. 3221-3227.

* cited by examiner

SEQUENCE-BASED POLAR CODE DESCRIPTION

CROSS REFERENCES

The present Application for Patent claims priority to U.S. Provisional Patent Application No. 62/514,613 by YANG, et al., entitled "SEQUENCE-BASED POLAR CODE DESCRIPTION," filed Jun. 2, 2017, assigned to the assignee hereof.

BACKGROUND

The following relates generally to wireless communication and more specifically to sequence-based polar code description.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system or a New Radio (NR) system). A wireless multiple-access communications system may include a number of base stations or access network nodes, each simultaneously supporting communication for multiple communication devices, which may be otherwise known as user equipment (UE).

Code blocks may be encoded by a transmitting device (e.g., a base station or UE) using an encoding algorithm. Error correcting codes may be used to introduce redundancy in a code block so that transmission errors may be detected and corrected. Some examples of encoding algorithms with error correcting codes include convolutional codes (CCs), low-density parity-check (LDPC) codes, and polar codes. Some coding techniques, such as polar coding, use reliability metrics during encoding and decoding such that information bits may be loaded at bit-channels of the encoder (or retrieved from bit-channels of the decoder) that are associated with favorable (e.g., high) reliability metrics. In some aspects, conventional techniques for describing the bit-channels that include information bits may be deficient.

SUMMARY

The described techniques relate to improved methods, systems, devices, or apparatuses that support an efficient sequence-based polar code description. In some cases, a transmitting wireless device (e.g., a user equipment (UE) or a base station) may encode a codeword from a set of information bits using a polar code, and a receiving wireless device (e.g., a user equipment (UE) or a base station) may receive the codeword and perform a decoding operation to attempt to retrieve the set of information bits. As described herein, the transmitting wireless device and the receiving wireless device may determine the bit locations of the set of information bits in the polar code, which may be described by one or more binary partition assignment vectors.

Specifically, the information bit locations may be given by partitioning bit-channels for one or more stages of polarization and assigning information bits to partitions based on the binary partition assignment vector associated with each stage of polarization. Once the partitions have a predetermined number of bit-channels (e.g., 64), the wireless device may assign the information bits within each group to a bit-channel based on a fixed sequence. The transmitting wireless device may encode the codeword based on the determined bit locations of the information bits, or the receiving device may decode the received codeword based on the determined bit locations.

A method for wireless communication is described. The method may include receiving a codeword over a wireless channel, where the codeword is based at least in part on a plurality of information bits encoded using a polar code, identifying a set of bit locations of the polar code for the plurality of information bits, where the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization, and decoding the received codeword according to the polar code to obtain an information bit vector at the set of bit locations.

An apparatus for wireless communication is described. The apparatus may include means for receiving a codeword over a wireless channel, where the codeword is based at least in part on a plurality of information bits encoded using a polar code, means for identifying a set of bit locations of the polar code for the plurality of information bits, where the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization, and means for decoding the received codeword according to the polar code to obtain an information bit vector at the set of bit locations.

Another apparatus for wireless communication is described. The apparatus may include a processor, memory in electronic communication with the processor, and instructions stored in the memory. The instructions may be operable to cause the processor to receive a codeword over a wireless channel, where the codeword is based at least in part on a plurality of information bits encoded using a polar code, identify a set of bit locations of the polar code for the plurality of information bits, where the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization, and decode the received codeword according to the polar code to obtain an information bit vector at the set of bit locations.

A non-transitory computer readable medium for wireless communication is described. The non-transitory computer-readable medium may include instructions operable to cause a processor to receive a codeword over a wireless channel, where the codeword is based at least in part on a plurality of information bits encoded using a polar code, identify a set of bit locations of the polar code for the plurality of information bits, where the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization, and decode the received codeword according to the polar code to obtain an information bit vector at the set of bit locations.

In some examples of the method, apparatus, and non-transitory computer-readable medium described above, the at least one stage of polarization includes a plurality of stages of polarization, and the assignment of the information bits for each stage of the plurality of stages of polarization includes recursively partitioning each partition for the each stage into sub-partitions and applying a respective binary partition assignment vector for the each stage to assign a number of information bits for the each partition of the each stage to the sub-partitions.

In some examples of the method, apparatus, and non-transitory computer-readable medium described above, a set of bit values of the binary partition assignment vector may be based at least in part on a size of the polar code. In some examples of the method, apparatus, and non-transitory computer-readable medium described above, the binary partition assignment vector includes an equal number of ones and zeros. In some examples of the method, apparatus, and non-transitory computer-readable medium described above, a size of the binary partition assignment vector for a first stage of polarization of the polar code may be based at least in part on a size of the polar code.

In some examples of the method, apparatus, and non-transitory computer-readable medium described above, a size of the respective binary partition assignment vector for the each stage may be half of the respective binary partition assignment vector for a previous stage of the recursive partitioning. In some examples of the method, apparatus, and non-transitory computer-readable medium described above, the recursive partitioning of bit-channels for the plurality of stages of polarization of the polar code may be terminated when each partition at a given stage of polarization includes a predetermined number of bit-channels.

In some examples of the method, apparatus, and non-transitory computer-readable medium described above, the assignment of information bits to bit-channels within each partition at the given stage of polarization may be based on a fixed sequence. In some examples of the method, apparatus, and non-transitory computer-readable medium described above, the fixed sequence may be derived from a polarization weight, a generator weight, a density evolution, a mutual information evaluation, an extrinsic information transfer chart based evaluation, or a combination thereof. In some examples of the method, apparatus, and non-transitory computer-readable medium described above, the information bits of the at least one stage of polarization may be assigned to a first partition or a second partition of the at least one stage of polarization based on ordered bit values of the binary partition assignment vector.

A method for wireless communication is described. The method may include encoding a codeword using a polar code for a transmission over a wireless channel, where the codeword includes an information bit vector including a plurality of information bits, identifying a set of bit locations of the polar code for the plurality of information bits, where the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization, and transmitting the encoded codeword over the wireless channel according to the polar code based at least in part on the set of bit locations.

An apparatus for wireless communication is described. The apparatus may include means for encoding a codeword using a polar code for a transmission over a wireless channel, where the codeword includes an information bit vector including a plurality of information bits, means for identifying a set of bit locations of the polar code for the plurality of information bits, where the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization, and means for transmitting the encoded codeword over the wireless channel according to the polar code based at least in part on the set of bit locations.

Another apparatus for wireless communication is described. The apparatus may include a processor, memory in electronic communication with the processor, and instructions stored in the memory. The instructions may be operable to cause the processor to encode a codeword using a polar code for a transmission over a wireless channel, where the codeword includes an information bit vector including a plurality of information bits, identify a set of bit locations of the polar code for the plurality of information bits, where the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization, and transmit the encoded codeword over the wireless channel according to the polar code based at least in part on the set of bit locations.

A non-transitory computer readable medium for wireless communication is described. The non-transitory computer-readable medium may include instructions operable to cause a processor to encode a codeword using a polar code for a transmission over a wireless channel, where the codeword includes an information bit vector including a plurality of information bits, identify a set of bit locations of the polar code for the plurality of information bits, where the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization, and transmit the encoded codeword over the wireless channel according to the polar code based at least in part on the set of bit locations.

In some examples of the method, apparatus, and non-transitory computer-readable medium described above, the at least one stage of polarization includes a plurality of stages of polarization, and the assignment of the information bits for each stage of the plurality of stages of polarization includes recursively partitioning each partition for the each stage into sub-partitions and applying a respective binary partition assignment vector for the each stage to assign a number of information bits for the each partition of the each stage to the sub-partitions.

In some examples of the method, apparatus, and non-transitory computer-readable medium described above, a set of bit values of the binary partition assignment vector may be based at least in part on a size of the polar code. In some examples of the method, apparatus, and non-transitory computer-readable medium described above, the binary partition assignment vector includes an equal number of ones and zeros. In some examples of the method, apparatus, and non-transitory computer-readable medium described above, a size of the binary partition assignment vector for a first stage of polarization of the polar code may be based at least in part on a size of the polar code.

In some examples of the method, apparatus, and non-transitory computer-readable medium described above, a size of the respective binary partition assignment vector for the each stage may be half of the respective binary partition assignment vector for a previous stage of the recursive partitioning. In some examples of the method, apparatus, and non-transitory computer-readable medium described above, the recursive partitioning of bit-channels for the plurality of stages of polarization of the polar code may be terminated when each partition at a given stage of polarization includes a predetermined number of bit-channels.

In some examples of the method, apparatus, and non-transitory computer-readable medium described above, the assignment of information bits to bit-channels within each partition at the given stage of polarization may be based on a fixed sequence. In some examples of the method, apparatus, and non-transitory computer-readable medium described above, the fixed sequence may be derived from a polarization weight, a generator weight, a density evolution, a mutual information evaluation, an extrinsic information transfer chart based evaluation, or a combination thereof. In some examples of the method, apparatus, and non-transitory computer-readable medium described above, the information bits of the at least one stage of polarization may be assigned to a first partition or a second partition of the at least one stage of polarization based on ordered bit values of the binary partition assignment vector.

DETAILED DESCRIPTION

Figure 1:
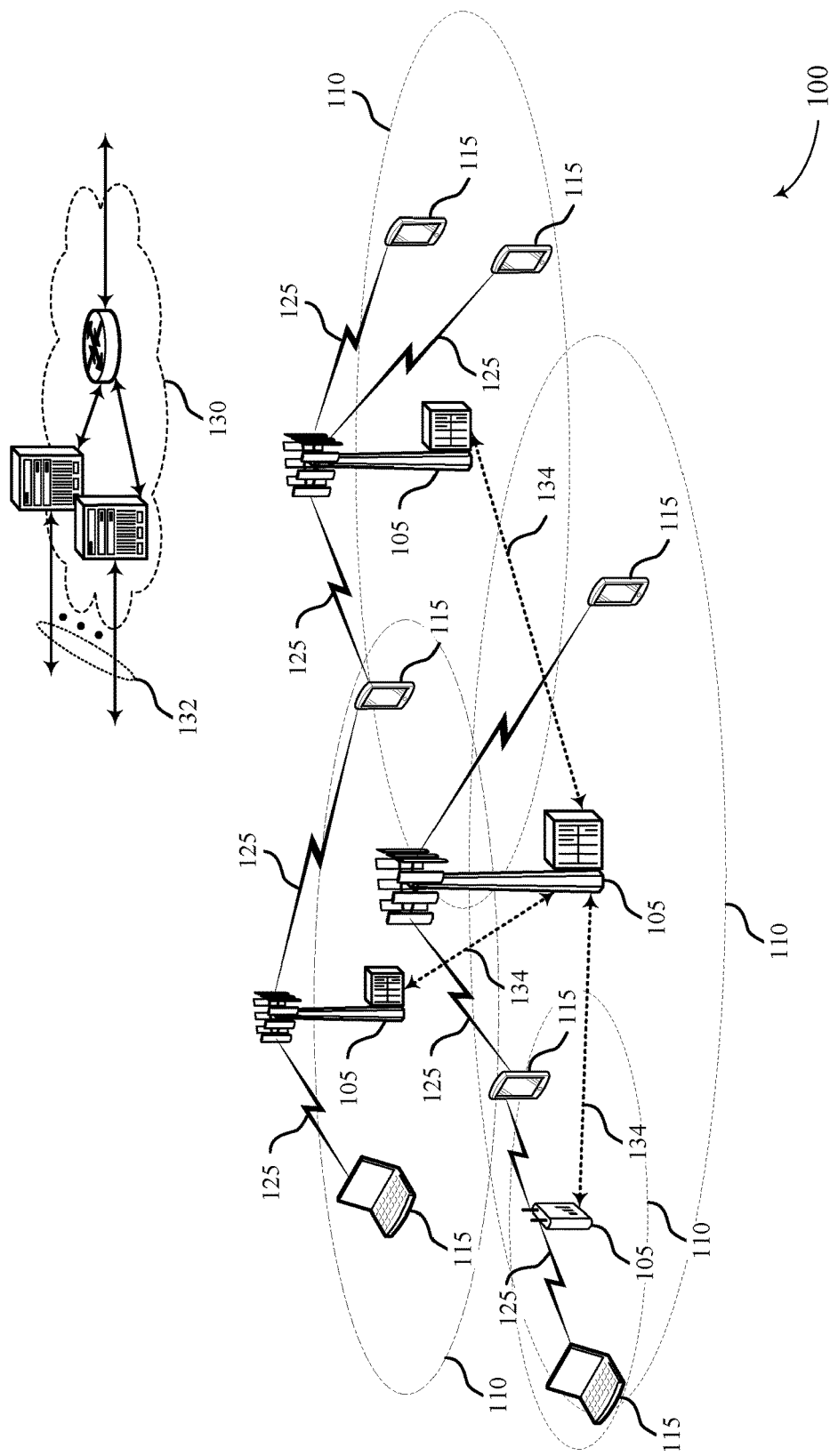
FIG. 1 illustrates an example of a wireless communications system that supports a sequence-based polar code description in accordance with various aspects of the present disclosure.

Techniques are described for determining bit locations of information bits in a codeword encoded using a sequence-based description for information bit locations for a polar code. A wireless device, such as a base station or a user equipment (UE), may encode a set of bits using a polar code to generate a codeword that is transmitted to a receiver via a wireless channel. The number of bits (N) generated by a polar code encoder may be determined based on a power function (e.g., $2^m$). A transmitting wireless device may identify a number of information bits (e.g., of an information bit vector) to include in the codeword, and may map the information bits to bit locations of different polarized bit-channels of the polar code based on a reliability order (or an approximation of the reliability order) of the bit-channels. The capacity of a given polarized bit-channel may be a function of a reliability metric of that bit-channel. Channel capacity may also be referred to herein as mutual information. Information bits may be loaded on the polarized bit-channels associated with the highest reliability metrics (or an approximation of the highest reliability metrics), and the remaining polarized bit-channels may be loaded with frozen bits (and parity bits, in some cases).

Transmitting and receiving wireless devices may determine bit locations of the information bits in the polar code for a given code length N based on an ordered list of the N bit-channels. For instance, a transmitting device may determine the bit locations of the information bits in order to map these bits to bit-channels of the polar code, and a receiving device may determine the bit locations of the information bits in order to decode these bits. However, conventional techniques for describing the bit-channels that include information bits may be deficient (e.g., may require a large number of bits). The techniques described herein support an efficient description of a sequence-based polar code that may be used to determine the bit locations of information bits in a polar code.

Specifically, bit-channels of a polar code may be recursively partitioned for one or more stages of polarization of the polar code, and information bits may be assigned to different partitions based on a binary partition assignment vector associated with each stage of polarization. Using these techniques, the number of bits used to describe the bit locations of the information bits (i.e., the sum of the number of bits included in each binary partition assignment vector at each stage of polarization) may be low when compared to the number of bits used to describe the bit locations of the information bits using conventional techniques.

Aspects of the disclosure introduced above are described below in the context of a wireless communications system. Examples of processes and signaling exchanges that support a sequence-based polar code description are then described. Aspects of the disclosure are further illustrated by and described with reference to apparatus diagrams, system diagrams, and flowcharts that relate to a sequence-based polar code description.

FIG. 1 illustrates an example of a wireless communications system 100 that supports a sequence-based polar code description in accordance with various aspects of the present disclosure. The wireless communications system 100 includes base stations 105, UEs 115, and a core network 130. In some examples, the wireless communications system 100 may be a Long Term Evolution (LTE) network, LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions from a base station 105 to a UE 115. Control information and data may be multiplexed on an uplink channel or downlink channel according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, IP connectivity, and other access, routing, or mobility functions. At least some of the network devices, such as base station 105, may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

In some cases, a wireless device (e.g., a base station 105 or a UE 115) may encode a set of information bits using a polar code for a transmission to another wireless device (e.g., a base station 105 or a UE 115). Wireless devices in wireless communications system 100 may support efficient techniques for determining a set of bit locations of a polar code at which to load information bits (e.g., for encoding) or at which to retrieve information bits (e.g., for decoding). Specifically, a transmitting device may determine bit locations at which to load information bits and a receiving device may determine bit locations at which to retrieve information bits. The bit locations may be based on partitioning bit-channels of a polar code at different stages of polarization and assigning information bits to different partitions at each stage of polarization based on a binary partition assignment vector associated with the stage of polarization. Once the information bits are assigned to partitions of a certain size (e.g., 64 bit-channels), the information bits may be mapped to specific bit-channels based on a fixed sequence.

Figure 2:
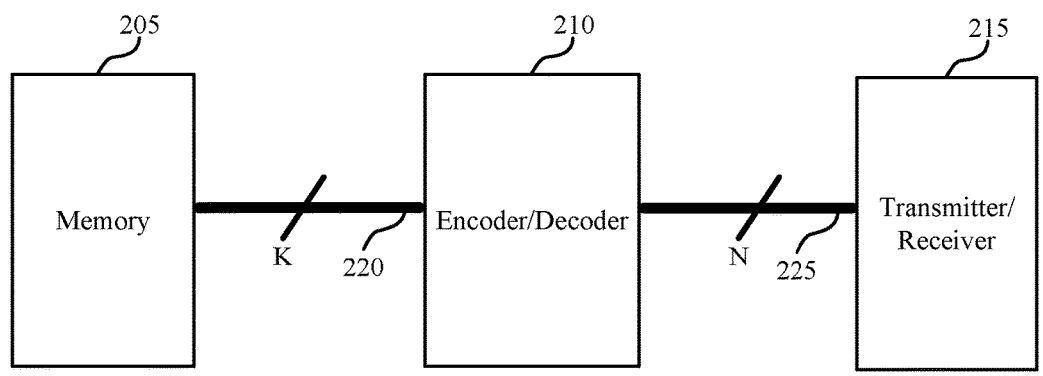
FIG. 2 illustrates an example of a device that supports a sequence-based polar code description in accordance with various aspects of the present disclosure.

FIG. 2 illustrates an example of a device 200 that supports a sequence-based polar code description in accordance with various aspects of the present disclosure. Device 200 may include memory 205, encoder/decoder 210, and transmitter/receiver 215. Bus 220 may connect memory 205 and encoder/decoder 210, and bus 225 may connect encoder/decoder 210 and transmitter/receiver 215. In some instances, device 200 may have data stored in memory 205 to be transmitted to another device, such as a UE 115 or a base station 105. To initiate data transmission, device 200 may retrieve the data, including information bits, from memory 205 for the transmission. The information bits included in memory 205 may be passed on to encoder/decoder 210 via bus 220. The number of information bits may be represented as a value K, as shown.

Encoder 210 may encode the K information bits and output a codeword having a length N, where K<N. Parity bits may be used in some forms of outer codes to provide redundancy to protect the information bits, and frozen bits may be denoted by a given value (0, 1, etc.) known to both the encoder and the decoder (i.e., the encoder encoding information bits at a transmitter, and the decoder decoding the codeword received at a receiver). From a transmitting device perspective, device 200 may encode information bits to produce a codeword, and the codeword may be transmitted via transmitter 215. From a receiving device perspective, device 200 may receive encoded data (e.g., a codeword) via receiver 215 and may decode the encoded data using decoder 210 to obtain the information bits.

As mentioned above, device 200 may generate a codeword of length N and dimensionality K (corresponding to the number of information bits) using a polar code. A polar code is an example of a linear block error correcting code has been shown to asymptotically approach the theoretical channel capacity as the code length increases. A polar code may transform unpolarized bit-channels using multiple polarization stages into polarized bit-channels (e.g., channel instances or sub-channels) that may each be associated with a reliability metric. A reliability metric of a polarized bit-channel may approximate the ability of the polarized bit-channel to successfully convey an information bit to a receiver. Each polarized bit-channel may then be loaded with an information bit or non-information bit (e.g., frozen bit or parity bit) for a transmission based on the reliability metrics of different polarized bit-channels (or an approximation of the reliability metrics of different polarized bit-channels). According to various aspects, reliability metrics may be determined based on a recursive partitioning of bit locations (e.g., channel instances or sub-channels) of the polar code, with assignment of information bits to sub-partitions at each polarization stage based on a partition assignment bit vector for the given stage.

Figure 3:
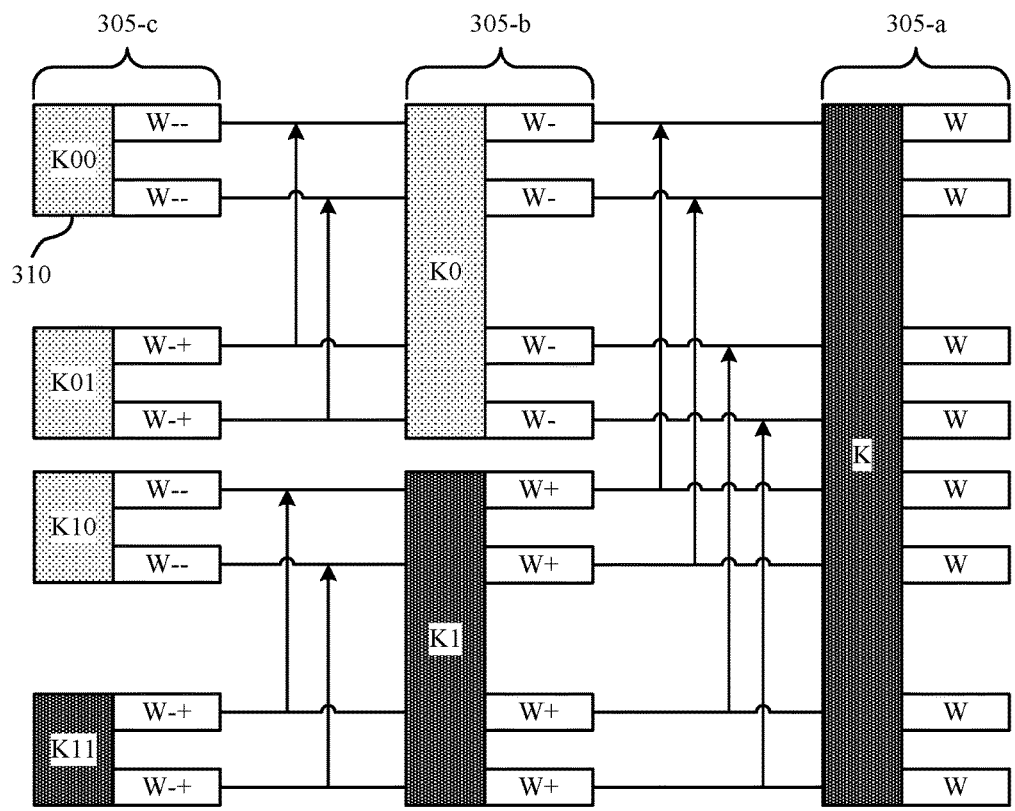
FIG. 3 illustrates an example of a polar coding scheme that supports a sequence-based polar code description in accordance with various aspects of the present disclosure.

FIG. 3 illustrates an example of a polar coding scheme 300 that implements a recursive partitioning of bit locations to allow a device to determine reliability metrics of bit-channels in accordance with various aspects of the present disclosure. In a first polarization stage 305-a, a set of unpolarized bit-channels may have polarization operations (e.g., single parity check or repetition operations) applied, and the resulting polarized bit-channels may each be associated with a reliability metric determined based on the reliability metric (or mutual information) of the unpolarized bit-channels. The polarized bit-channels may then be partitioned into sectors or groups based on the determined reliability metrics of the different polarized bit-channels. For example, the bit-channels corresponding to the single parity check operation may be partitioned into a first, lower reliability group, while the bit-channels corresponding to a repetition operation may be partitioned into a second, higher reliability group. The polarization process may continue recursively through a second stage of polarization 305-b until each partition reaches a given size 310 at a third stage of polarization 305-c.

A transmitting device may identify a number of information bits for a transmission (e.g., of an information bit vector), and the transmitting device may allocate or distribute the information bits to different groups of polarized bit-channels during the recursive partitioning based on a capacity of the different groups. Since the capacity of the different groups may be based on the reliability metric of different polarized bit-channels, subsets of the information bits may be distributed or allocated to different groups of polarized channels based on the reliability metrics associated with the different groups of polarized channels. The information bits may then be assigned to specific polarized bit-channels within a group based on a polarization metric (e.g., polarization weight, density evolution, etc.). Assigning information bits within each group may be based on a predetermined ranking of bit-channels within the groups. As such, the information bits may be loaded on the polarized bit-channels associated with the highest reliability metrics (or an approximation of the highest reliability metrics), and the remaining bits (e.g., parity bits and frozen bits) may be loaded on the remaining polarized bit-channels.

In some aspects, it may be appropriate to describe the bit locations of information bits in a polar code such that a device may be able to encode or decode a codeword based on the bit locations of the information bits. In some cases, the number of possible bit locations for information bits in a polar code may correspond to the number of bits generated by the polar code (i.e., N bits) and it may be appropriate to describe the bit locations for each value of N generated by the polar code. Thus, in some examples, the bit locations of each coded bit may be described using $\log_2 N$ bits, and the bit locations of all N bits generated by the polar code may be described using $N*\log_2 N$ bits. However, these techniques may be deficient since the number of bits used to describe the bit locations of all bits generated by the polar code may be high.

In other cases (e.g., as described with reference to FIG. 3), a device may map coded bits of a polar code to different groups of bit-channels of a certain size 'S' (e.g., 64 bit-channels at a third stage of polarization 305-c). The coded bits may then be mapped to bit-channels in a group using a fixed sequence that is based on a polarization metric (e.g., polarization weight, density evolution, etc.). The fixed sequence may be described using $S*\log_2 S$ bits. Additionally, the group that includes each coded bit of the polar code may be described using $$\log_2 \frac{N}{S} \text{ bits,}$$

and the groups that include all bits of the polar code may be described using $$N * \log_2 \frac{N}{S} \text{ bits.}$$

Thus, the number of bits used to describe the bit locations of all bits in the polar code may be equal to $$S * \log_2 S + N * \log_2 \frac{N}{S} \text{ bits.}$$

Although using fewer bits than using an explicit ordering of bit-channels, these techniques may also be deficient since the number of bits used to describe the bit locations of all bits generated by the polar code may still be relatively high.

As described herein, the bit locations for information bits for a polar code used to encode a codeword to be transmitted or decode a received codeword may be efficiently described using recursive partitioning and binary partition assignment vectors. Specifically, bit-channels for one or more stages of polarization may be recursively partitioned, and the information bits for each stage of polarization may be assigned to sub-partitions based on a binary partition assignment vector. Each bit of the binary partition assignment vector may determine that in information bit, if present for the partition, is assigned to a first sub-partition (e.g., higher reliability partition), or a second sub-partition (lower reliability partition). As an example, for an information bit of the K information bits in FIG. 3, the wireless device may determine that a binary partition assignment vector at stage 305-a indicates that the information bit is loaded onto a bit-channel in a lower group of bit-channels (K1). The wireless device may then partition the bit-channels of the K1 information bits (including the information bit) and determine that a binary partition assignment vector at stage 305-b indicates that the information bit is loaded onto a bit-channel in a lower group of bit-channels (K11).

At the third stage of polarization 305-c, the recursive partitioning of bit-channels may terminate since each group of bit-channels at the third stage of polarization 305-c may include a certain number of bit-channels 'S.' The number of information bits that have propagated to each group may then be assigned to a specific bit-channel of the group based on a fixed sequence. Using these techniques, the bit locations of each coded bit of a polar code may be described using N bits at stage 305-a and N/2 bits at stage 305-b. Then, at stage 305-c, the bit locations of each coded bit may be based on the fixed sequence which may be described using $S*\log_2 S$ bits. Thus, the number of bits used to describe the bit locations (or the bit sequence) of all bits in the polar code may be equal to $S*\log_2 S+N+N/2$ bits, which may be less than the number of bits used to describe the bit locations of all bits in the polar code using the other conventional techniques described above. The technique can be extended as additional stages are present in the polar code to support higher values of N. As can be understood, the number of bits used for any given value of N will be given by $S*\log_2 S$ plus the sequence $$N + \frac{N}{2} + \frac{N}{4} \ldots + 2S,$$

which approaches the limit of 2N as N increases. Thus, the upper bound for describing the locations for information bits of the polar code having any of multiple code lengths satisfying $2^m$ where m is an integer, up to and including N, is given by $S*\log_2 S+2N$.

Figure 4:
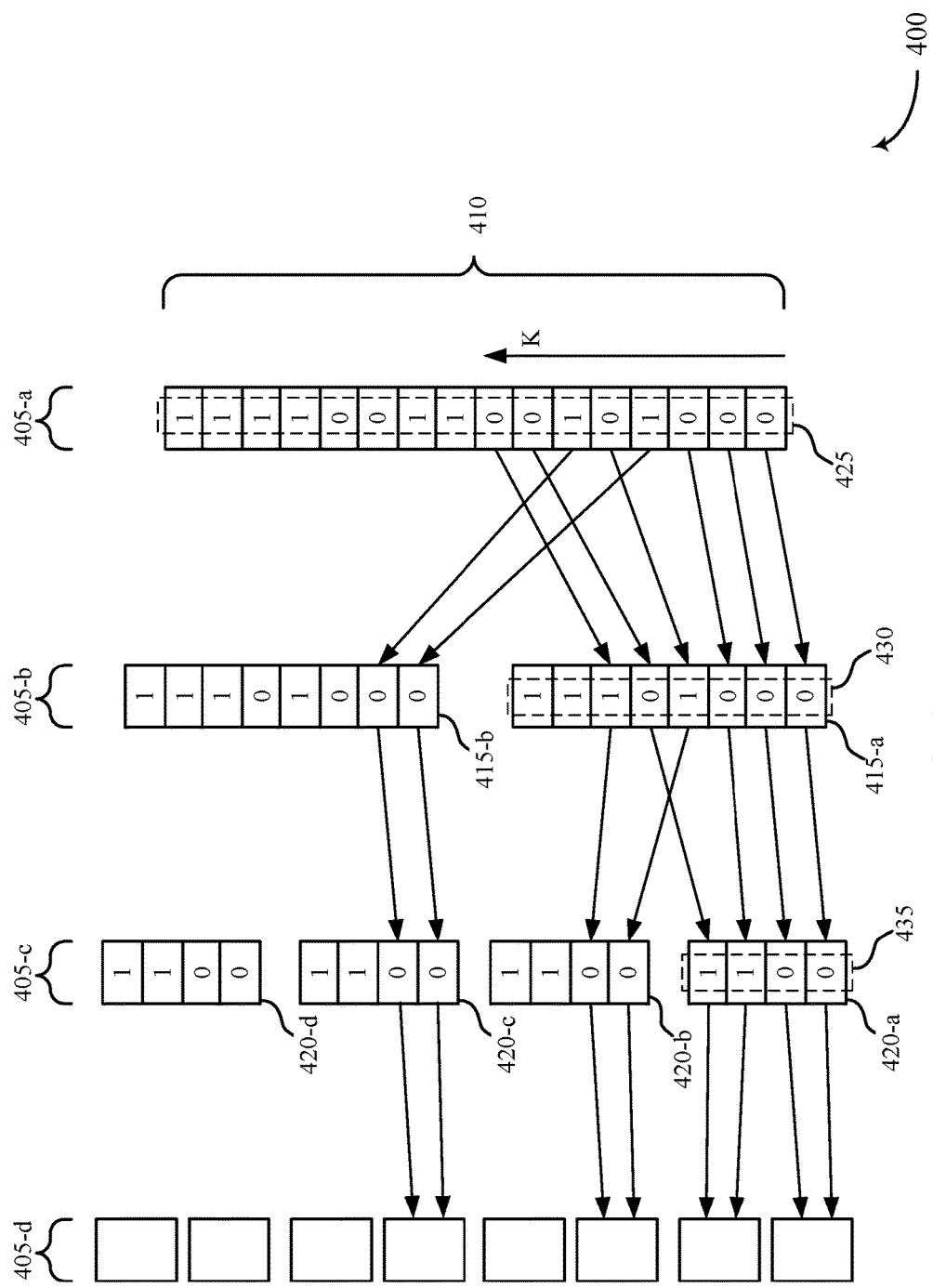
FIG. 4 illustrates an example diagram of a recursive partitioning of bit-channels for different stages of polarization in accordance with various aspects of the present disclosure.

FIG. 4 illustrates an example diagram 400 of a recursive partitioning of bit-channels for different stages of polarization in accordance with various aspects of the present disclosure. In some aspects of FIG. 4, a wireless device may encode a set of information bits (e.g., K information bits), where K may be less than or equal to the length of the polar code N. In some examples, bit locations of the information bits may be determined based on the binary partition assignment vectors 425, 430, and 435 to either encode a codeword to be transmitted or decode a received codeword.

In the example of FIG. 4, the wireless device may generate N=16 coded bits for a transmission to another wireless device over a wireless channel. At a first stage of polarization 405-a, the unpolarized bit-channels 410 may be partitioned into two sub-partitions 415 of bit-channels. The wireless device may then use the binary partition assignment vector 425 to determine how many of the information bits to assign to a lower sub-partition of bit-channels (e.g., associated with a higher reliability) or an upper sub-partition of bit-channels (e.g., associated with a lower reliability).

As an example, the binary partition assignment vectors may be used to determine bit-channels for information bits where K=8. Starting from a first bit position (e.g., the bottom in FIG. 4) of binary partition assignment vector 425, the bit values of a portion of the binary partition assignment vector 425 may be used to determine how many of the eight (8) information bits are to be allocated to the lower sub-partition and the upper sub-partition. In the illustrated example, a bit value of '0' in a binary partition assignment vector indicates that an information bit is to be assigned to the lower sub-partition while a bit value of '1' in the binary partition assignment vector indicates that an information bit is to be assigned to the upper sub-partition. Thus, six (6) of the information bits may be allocated to the lower sub-partition 415-a and two (2) of the information bits may be allocated to the upper sub-partition 415-b.

At the second stage of polarization 405-b, each of the two (2) partitions 415 of bit-channels may be partitioned into sub-partitions 420 of bit-channels. The binary partition assignment vector 430 may be used in the same way that binary partition assignment vector 425 was used at stage 405-a. Specifically, the binary partition assignment vector 430 may be used to assign the six (6) bits assigned to the lower partition 415-a at the second stage of polarization to the lower sub-partition 420-a or upper sub-partition 420-b, and the second binary partition assignment vector 430 may also be used to assign the two (2) bits assigned to the upper partition 415-b to the lower sub-partition 420-c or upper sub-partition 420-d.

At the third stage of polarization 405-c, the wireless device may repeat the process of partitioning and assigning bits (e.g., information bits) to partitions based on the binary partition assignment vector 435. After this stage, the wireless device may determine that the size of the groups of bit-channels (i.e., at stage 405-d) include a predetermined number of bit-channels (e.g., two (2) in the example of FIG. 4), and the wireless device may terminate the process of recursively partitioning the bit-channels at this stage. The wireless device may then use a fixed sequence to determine the mapping of the information bits to specific bit-channels within each group.

As each sub-partition at a given stage of polarization 405 includes the same number of bits, each binary partition assignment vector may include an equal number of ones and zeros such that if, for a given stage, a partition is assigned to a number of information bits matching the partition length, each information bit is assigned to a sub-partition. The example provided is simplified for ease of illustration and the techniques described herein may generally be applied to cases where the codeword length N is above a specific threshold (e.g., 128, 256, etc.). In such examples when the codeword length N is larger, the size of the group of bit-channels at which the recursive partitioning is terminated may also be larger (e.g., 64 bit-channels) to allow for improved performance of the polar code.

Accordingly, using these techniques the location of the information bits (e.g., the bit-channels in the U-domain) may be described using $$S*\log_2 S + N + \frac{N}{2} + \frac{N}{4} \ldots + 2S \text{ bits.}$$

For example, where N=512 and S=64, the number of bits for describing the information bit locations using recursive partitioning and binary partition assignment is 1280 bits. Notably, this supports polar codes of N∈{64, 128, 256, 512}. Furthermore, to extend this polar code description to support N∈{64, 128, 256, 512, 1024}, only another 1024 bits are needed. These techniques may be preferred since, as described above, the number of bits used to describe the location of the information bits using conventional techniques may be either $$N*\log_2 N \text{ or } S*\log_2 S + N*\log_2 \frac{N}{S}.$$

Thus, in the example described above for N=512 and S=64, the location of the information bits may be described using either 4608 bits or 1920 bits respectively based on the conventional techniques, each of which is significantly greater than the 1280 bits used to describe the same sequence using the techniques described herein. Furthermore, in the case of the conventional description of an order of bit locations, separate descriptions may be needed for different values of N.

In some examples, shortening (e.g., known-bit puncturing) may be used for rate matching purposes. In that instance, locations of shortened bits in the binary partition assignment vector are skipped, and the information bit counter used to determine how many information bits have been assigned using the binary partition assignment vector is not incremented for the shortened bit. The corresponding bit-channels for shortened bits are then loaded with known bit values (e.g., treated as frozen bits).

Figure 5:
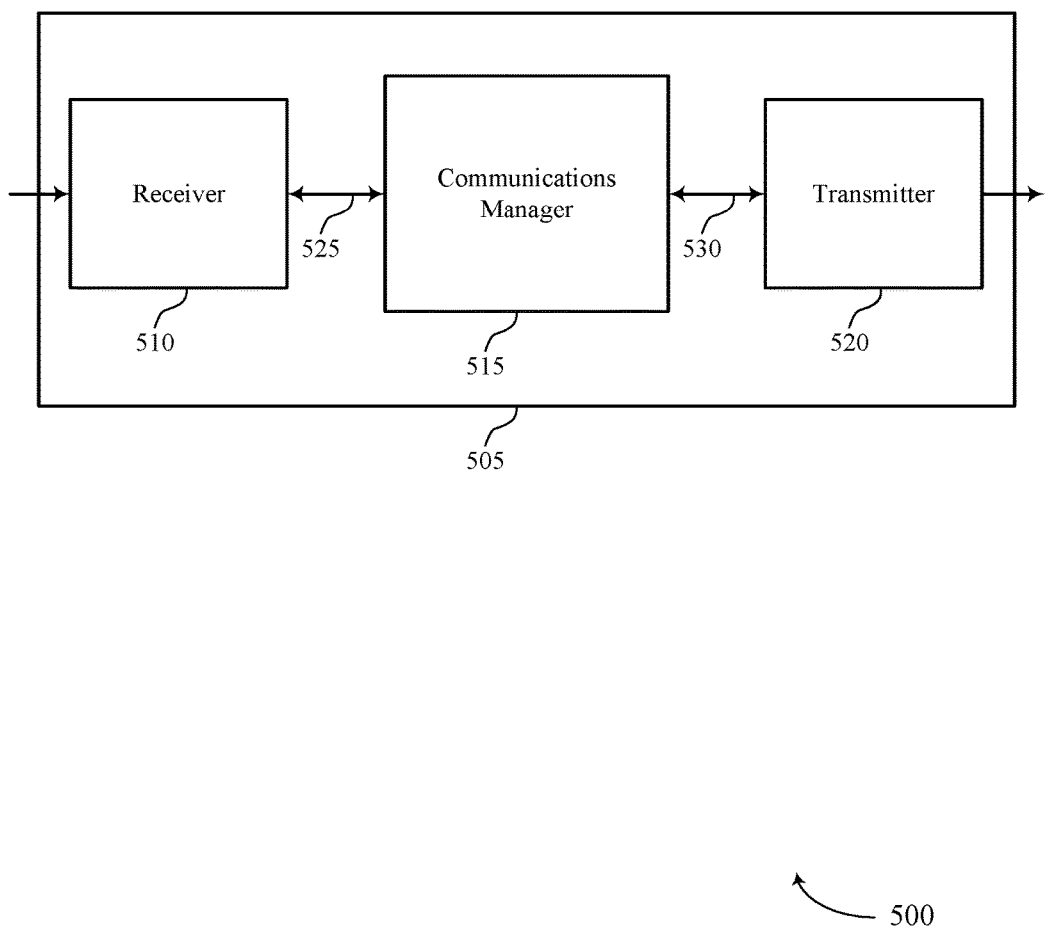
FIGS. 5 and 6 show block diagrams of a device that supports a sequence-based polar code description in accordance with various aspects of the present disclosure.

FIG. 5 shows a block diagram 500 of a wireless device 505 that supports a sequence-based polar code description in accordance with various aspects of the present disclosure. Wireless device 505 may be an example of aspects of a UE 115 or base station 105 as described herein. Wireless device 505 may include receiver 510, communications manager 515, and transmitter 520. Wireless device 505 may also include a processor. Each of these components may be in communication with one another (e.g., via one or more buses).

Receiver 510 may receive information such as packets, user data, or control information associated with various information channels (e.g., control channels, data channels, and information related to sequence-based polar code description, etc.). Information may be passed on to other components of the device, for example, via link 525. The receiver 510 may be an example of aspects of the transceiver 735 or the transceiver 835 described with reference to FIGS. 7 and 8. The receiver 510 may utilize a single antenna or a set of antennas.

Transmitter 520 may transmit signals generated by other components of the device. In some cases, transmitter 520 may be in communication with communications manager 515 via link 530. In some examples, the transmitter 520 may be collocated with a receiver 510 in a transceiver module. For example, the transmitter 520 may be an example of aspects of the transceiver 735 or the transceiver 835 described with reference to FIGS. 7 and 8. The transmitter 520 may utilize a single antenna or a set of antennas.

Communications manager 515 may be an example of aspects of the communications manager 615, the communications manager 715, or the communications manager 815 described with reference to FIGS. 6, 7, and 8. Communications manager 515 and/or at least some of its various sub-components may be implemented in hardware, software executed by a processor, firmware, or any combination thereof. If implemented in software executed by a processor, the functions of the communications manager 515 and/or at least some of its various sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The communications manager 515 and/or at least some of its various sub-components may be physically located at various positions, including being distributed such that portions of functions are implemented at different physical locations by one or more physical devices. In some examples, communications manager 515 and/or at least some of its various sub-components may be a separate and distinct component in accordance with various aspects of the present disclosure. In other examples, communications manager 515 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Receiver 510 may receive a codeword over a wireless channel, where the codeword is based on a set of information bits encoded using a polar code, and receiver 510 may pass the codeword to communications manager 515 via link 525. Communications manager 515 may identify a set of bit locations of the polar code for the set of information bits, where the set of bit locations is determined based on a partitioning of bit-channels for at least one stage of polarization of the polar code and assigning information bits of the at least one stage of polarization to partitions based on a binary partition assignment vector associated with the at least one stage of polarization and decode the received codeword according to the polar code to obtain an information bit vector at the set of bit locations.

The communications manager 515 may also encode a codeword using a polar code for a transmission over a wireless channel, where the codeword includes an information bit vector including a set of information bits and identify a set of bit locations of the polar code for the set of information bits, where the set of bit locations is determined based on a partitioning of bit-channels for at least one stage of polarization of the polar code and assigning information bits of the at least one stage of polarization to partitions based on a binary partition assignment vector associated with the at least one stage of polarization. Communications manager 515 may then pass the encoded codeword to transmitter 520 via link 530, and transmitter 520 may transmit the encoded codeword over the wireless channel according to the polar code based on the set of bit locations.

Figure 6:
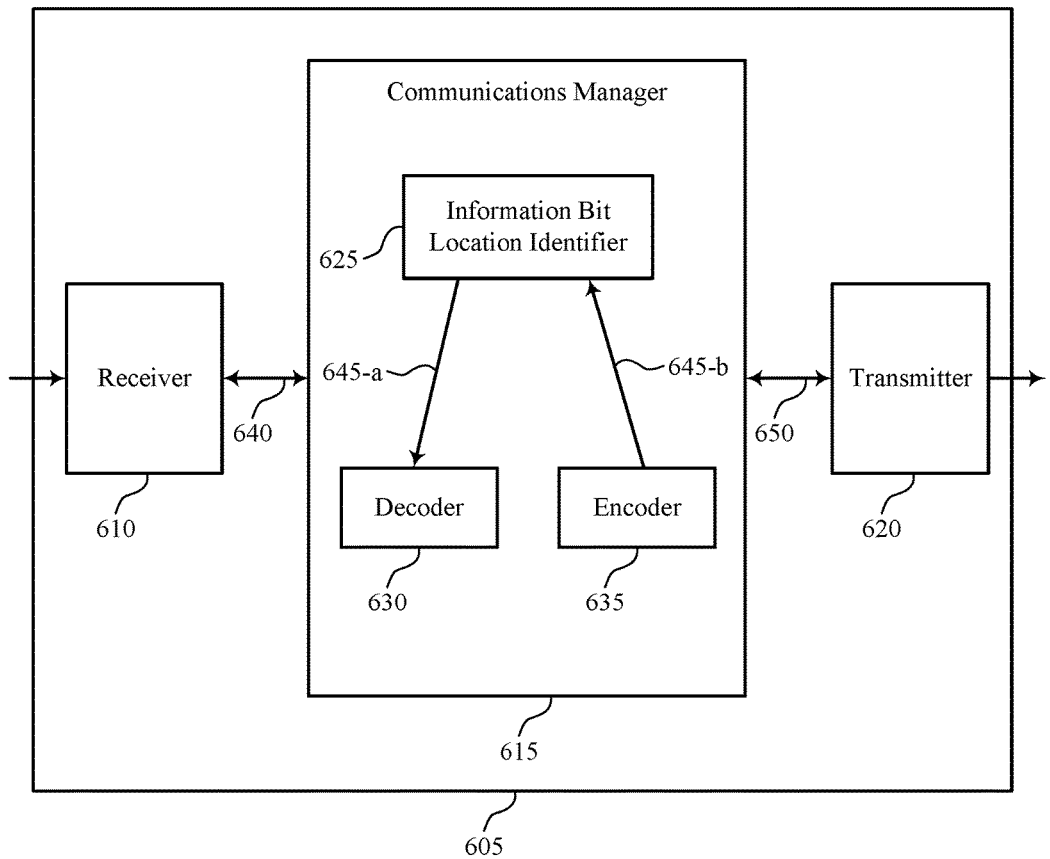

FIG. 6 shows a block diagram 600 of a wireless device 605 that supports sequence-based polar code description in accordance with various aspects of the present disclosure. Wireless device 605 may be an example of aspects of a wireless device 505 or a UE 115 or base station 105 as described with reference to FIG. 5. Wireless device 605 may include receiver 610, communications manager 615, and transmitter 620. Wireless device 605 may also include a processor. Each of these components may be in communication with one another (e.g., via one or more buses).

Receiver 610 may receive information such as packets, user data, or control information associated with various information channels (e.g., control channels, data channels, and information related to sequence-based polar code description, etc.). Information may be passed on to other components of the device, for example, via link 640. The receiver 610 may be an example of aspects of the transceiver 735 or the transceiver 835 described with reference to FIGS. 7 and 8. The receiver 610 may utilize a single antenna or a set of antennas.

Communications manager 615 may be an example of aspects of the communications manager 515, communications manager 715, or communications manager 815 described with reference to FIGS. 5, 7, and 8. Communications manager 615 may include information bit location identifier 625, decoder 630, and encoder 635.

In some aspects, receiver 610 may receive a codeword over a wireless channel, where the codeword is based on a set of information bits encoded using a polar code, and receiver 610 may pass the codeword to information bit location identifier via link 640. Information bit location identifier 625 may identify a set of bit locations of the polar code for the set of information bits, where the set of bit locations is determined based on a partitioning of bit-channels for at least one stage of polarization of the polar code and assigning information bits of the at least one stage of polarization to partitions based on a binary partition assignment vector associated with the at least one stage of polarization. Information bit location identifier 625 may then pass the information bit locations 645-*a* of the set of information bits to decoder 630, and decoder 630 may decode the received codeword according to the polar code to obtain an information bit vector at the set of bit locations.

In other aspects, encoder 635 may encode a codeword using a polar code for a transmission over a wireless channel, where the codeword includes an information bit vector including a set of information bits, and encoder 635 may pass the information bit locations 645-*b* of the set of information bits to information bit location identifier 625. Information bit location identifier 625 may identify a set of bit locations of the polar code for the set of information bits, where the set of bit locations is determined based on a partitioning of bit-channels for at least one stage of polarization of the polar code and assigning information bits of the at least one stage of polarization to partitions based on a binary partition assignment vector associated with the at least one stage of polarization. Information bit location identifier 625 may then pass the encoded codeword to transmitter 620 via link 650, and transmitter 620 may transmit the encoded codeword over the wireless channel according to the polar code based on the set of bit locations.

In some cases, the at least one stage of polarization includes a set of stages of polarization, and the assignment of the information bits for each stage of the set of stages of polarization includes recursively partitioning each partition for the each stage into sub-partitions and applying a respective binary partition assignment vector for the each stage to assign a number of information bits for the each partition of the each stage to the sub-partitions. In some cases, a set of bit values of the binary partition assignment vector is based on a size of the polar code. In some cases, the binary partition assignment vector includes an equal number of ones and zeros. In some cases, a size of the binary partition assignment vector for a first stage of polarization of the polar code is based on a size of the polar code. In some cases, a size of the respective binary partition assignment vector for the each stage is half of the respective binary partition assignment vector for a previous stage of the recursive partitioning.

In some cases, the recursive partitioning of bit-channels for the set of stages of polarization of the polar code is terminated when each partition at a given stage of polarization includes a predetermined number of bit-channels. In some cases, the assignment of information bits to bit-channels within each partition at the given stage of polarization is based on a fixed sequence. In some cases, the fixed sequence is derived from a polarization weight, a generator weight, a density evolution, a mutual information evaluation, an extrinsic information transfer chart based evaluation, or a combination thereof. In some cases, the information bits of the at least one stage of polarization are assigned to a first partition or a second partition of the at least one stage of polarization based on ordered bit values of the binary partition assignment vector.

Transmitter 620 may transmit signals generated by other components of the device. In some cases, transmitter 620 may be in communication with communications manager 615 via link 650. In some examples, the transmitter 620 may be collocated with a receiver 610 in a transceiver module. For example, the transmitter 620 may be an example of aspects of the transceiver 735 or the transceiver 835 described with reference to FIGS. 7 and 8. The transmitter 620 may utilize a single antenna or a set of antennas.

Figure 7:
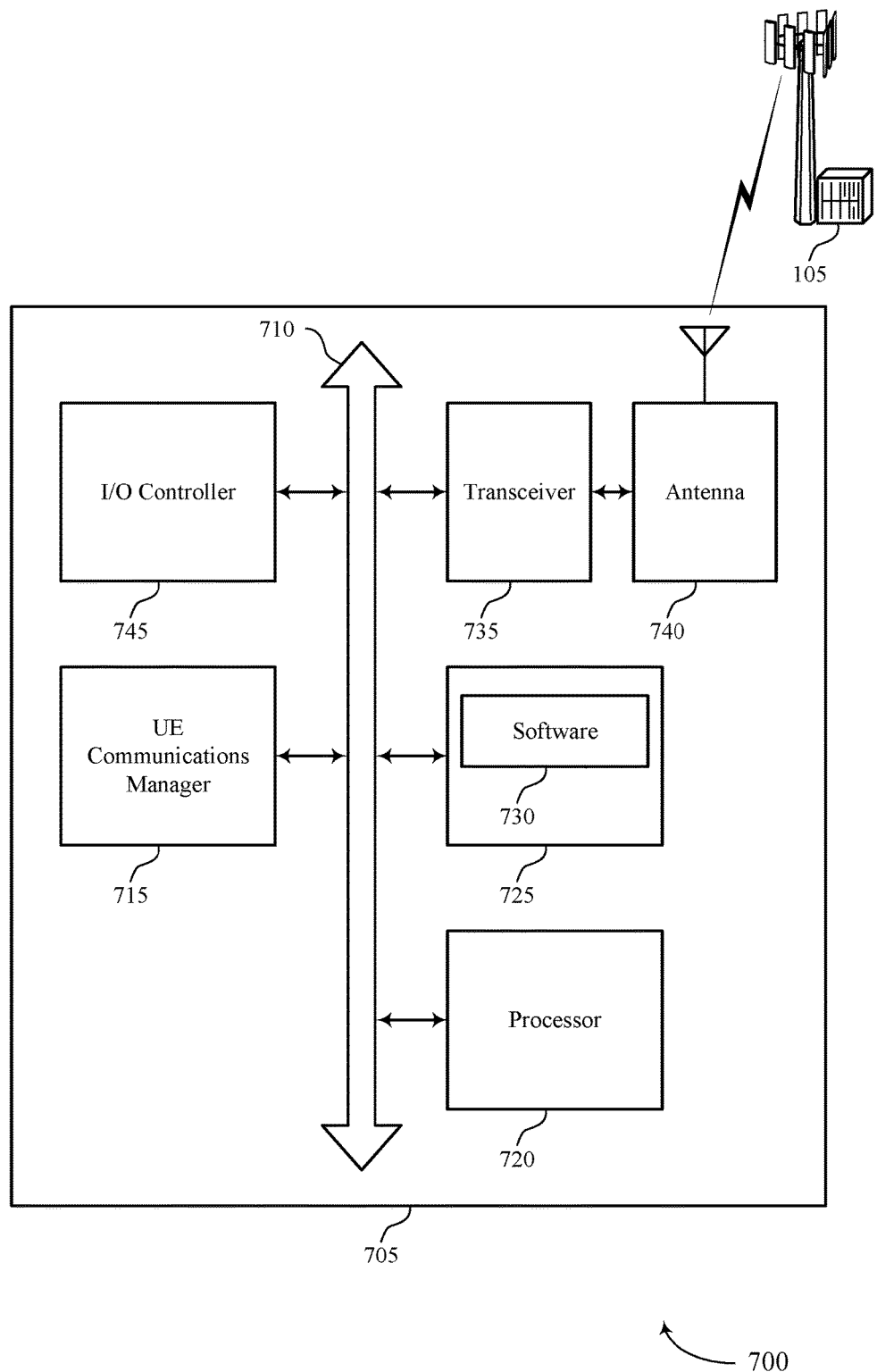
FIG. 7 illustrates a block diagram of a system including a user equipment (UE) that supports a sequence-based polar code description in accordance with various aspects of the present disclosure.

FIG. 7 shows a diagram of a system 700 including a device 705 that supports sequence-based polar code description in accordance with various aspects of the present disclosure. Device 705 may be an example of or include the components of wireless device 505, wireless device 605, or a UE 115 as described above, e.g., with reference to FIGS. 5 and 6. Device 705 may include components for bi-directional voice and data communications including components for transmitting and receiving communications, including UE communications manager 715, processor 720, memory 725, software 730, transceiver 735, antenna 740, and I/O controller 745. These components may be in electronic communication via one or more buses (e.g., bus 710). Device 705 may communicate wirelessly with one or more base stations 105.

Processor 720 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 720 may be configured to operate a memory array using a memory controller. In other cases, a memory controller may be integrated into processor 720. Processor 720 may be configured to execute computer-readable instructions stored in a memory to perform various functions (e.g., functions or tasks supporting sequence-based polar code description).

Memory 725 may include random access memory (RAM) and read only memory (ROM). The memory 725 may store computer-readable, computer-executable software 730 including instructions that, when executed, cause the processor to perform various functions described herein. In some cases, the memory 725 may contain, among other things, a basic input/output system (BIOS) which may control basic hardware or software operation such as the interaction with peripheral components or devices.

Software 730 may include code to implement aspects of the present disclosure, including code to support sequence-based polar code description. Software 730 may be stored in a non-transitory computer-readable medium such as system memory or other memory. In some cases, the software 730 may not be directly executable by the processor but may cause a computer (e.g., when compiled and executed) to perform functions described herein.

Transceiver 735 may communicate bi-directionally, via one or more antennas, wired, or wireless links as described above. For example, the transceiver 735 may represent a wireless transceiver and may communicate bi-directionally with another wireless transceiver. The transceiver 735 may also include a modem to modulate the packets and provide the modulated packets to the antennas for transmission, and to demodulate packets received from the antennas. In some cases, the wireless device may include a single antenna 740. However, in some cases, the device may have more than one antenna 740, which may be capable of concurrently transmitting or receiving multiple wireless transmissions.

I/O controller 745 may manage input and output signals for device 705. I/O controller 745 may also manage peripherals not integrated into device 705. In some cases, I/O controller 745 may represent a physical connection or port to an external peripheral. In some cases, I/O controller 745 may utilize an operating system such as iOS®, ANDROID®, MS-DOS®, MS-WINDOWS®, OS/2®, UNIX®, LINUX®, or another known operating system. In other cases, I/O controller 745 may represent or interact with a modem, a keyboard, a mouse, a touchscreen, or a similar device. In some cases, I/O controller 745 may be implemented as part of a processor. In some cases, a user may interact with device 705 via I/O controller 745 or via hardware components controlled by I/O controller 745.

Figure 8:
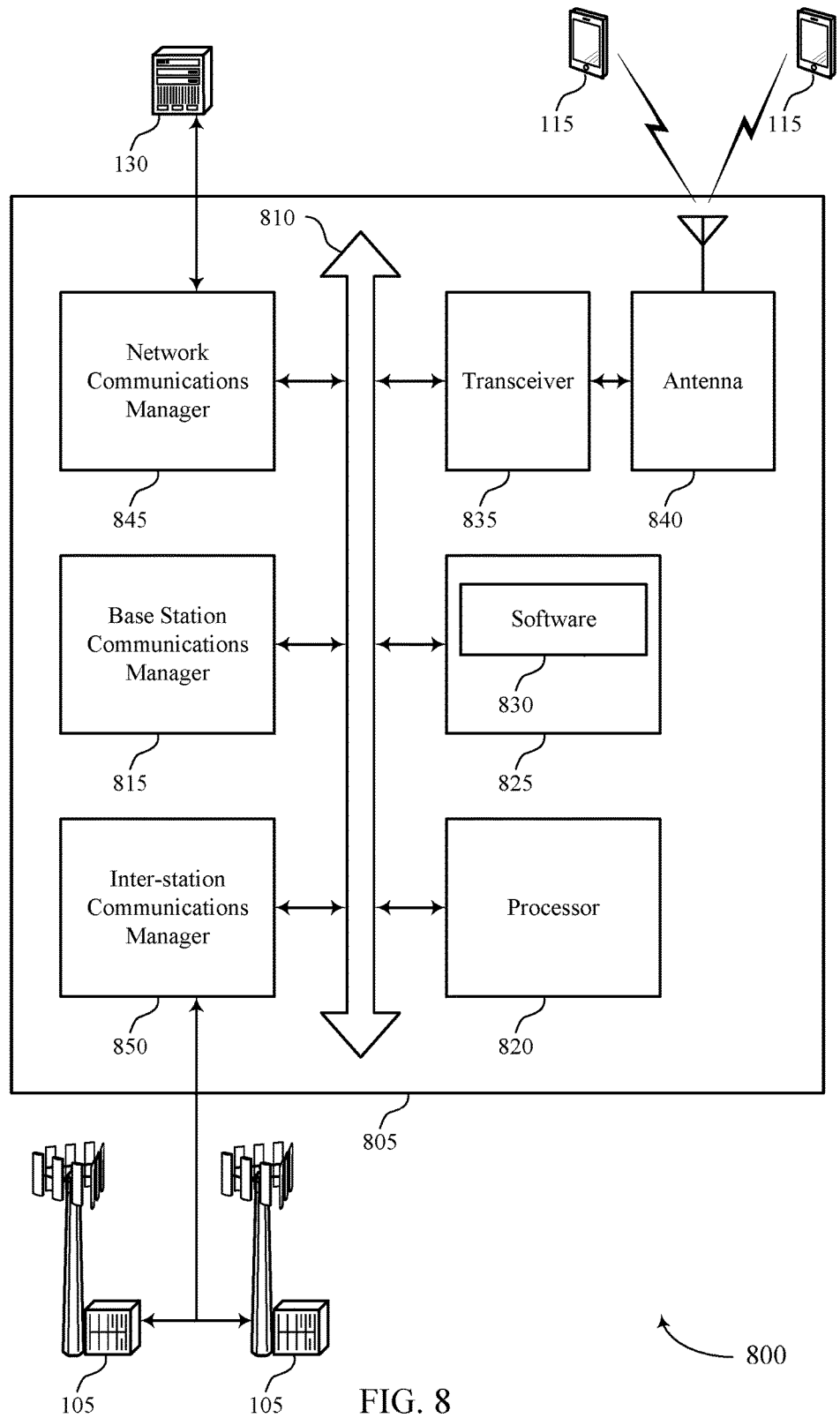
FIG. 8 illustrates a block diagram of a system including a base station that supports a sequence-based polar code description in accordance with various aspects of the present disclosure.

FIG. 8 shows a diagram of a system 800 including a device 805 that supports a sequence-based polar code description in accordance with various aspects of the present disclosure. Device 805 may be an example of or include the components of wireless device 505, wireless device 605, or a base station 105 as described above, e.g., with reference to FIGS. 1, 5, and 6. Device 805 may include components for bi-directional voice and data communications including components for transmitting and receiving communications, including base station communications manager 815, processor 820, memory 825, software 830, transceiver 835, antenna 840, network communications manager 845, and inter-station communications manager 850. These components may be in electronic communication via one or more buses (e.g., bus 810). Device 805 may communicate wirelessly with one or more UEs 115.

Processor 820 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 820 may be configured to operate a memory array using a memory controller. In other cases, a memory controller may be integrated into processor 820. Processor 820 may be configured to execute computer-readable instructions stored in a memory to perform various functions (e.g., functions or tasks supporting sequence-based polar code description).

Memory 825 may include RAM and ROM. The memory 825 may store computer-readable, computer-executable software 830 including instructions that, when executed, cause the processor to perform various functions described herein. In some cases, the memory 825 may contain, among other things, a BIOS which may control basic hardware or software operation such as the interaction with peripheral components or devices.

Software 830 may include code to implement aspects of the present disclosure, including code to support sequence-based polar code description. Software 830 may be stored in a non-transitory computer-readable medium such as system memory or other memory. In some cases, the software 830 may not be directly executable by the processor but may cause a computer (e.g., when compiled and executed) to perform functions described herein.

Transceiver 835 may communicate bi-directionally, via one or more antennas, wired, or wireless links as described above. For example, the transceiver 835 may represent a wireless transceiver and may communicate bi-directionally with another wireless transceiver. The transceiver 835 may also include a modem to modulate the packets and provide the modulated packets to the antennas for transmission, and to demodulate packets received from the antennas.

In some cases, the wireless device may include a single antenna 840. However, in some cases the device may have more than one antenna 840, which may be capable of concurrently transmitting or receiving multiple wireless transmissions. Network communications manager 845 may manage communications with the core network (e.g., via one or more wired backhaul links). For example, the network communications manager 845 may manage the transfer of data communications for client devices, such as one or more UEs 115.

Inter-station communications manager 850 may manage communications with other base station 105, and may include a controller or scheduler for controlling communications with UEs 115 in cooperation with other base stations 105. For example, the inter-station communications manager 850 may coordinate scheduling for transmissions to UEs 115 for various interference mitigation techniques such as beamforming or joint transmission. In some examples, inter-station communications manager 850 may provide an X2 or Xn interface within LTE/LTE-A or NR wireless communication networks to provide communication between base stations 105.

Figure 9:
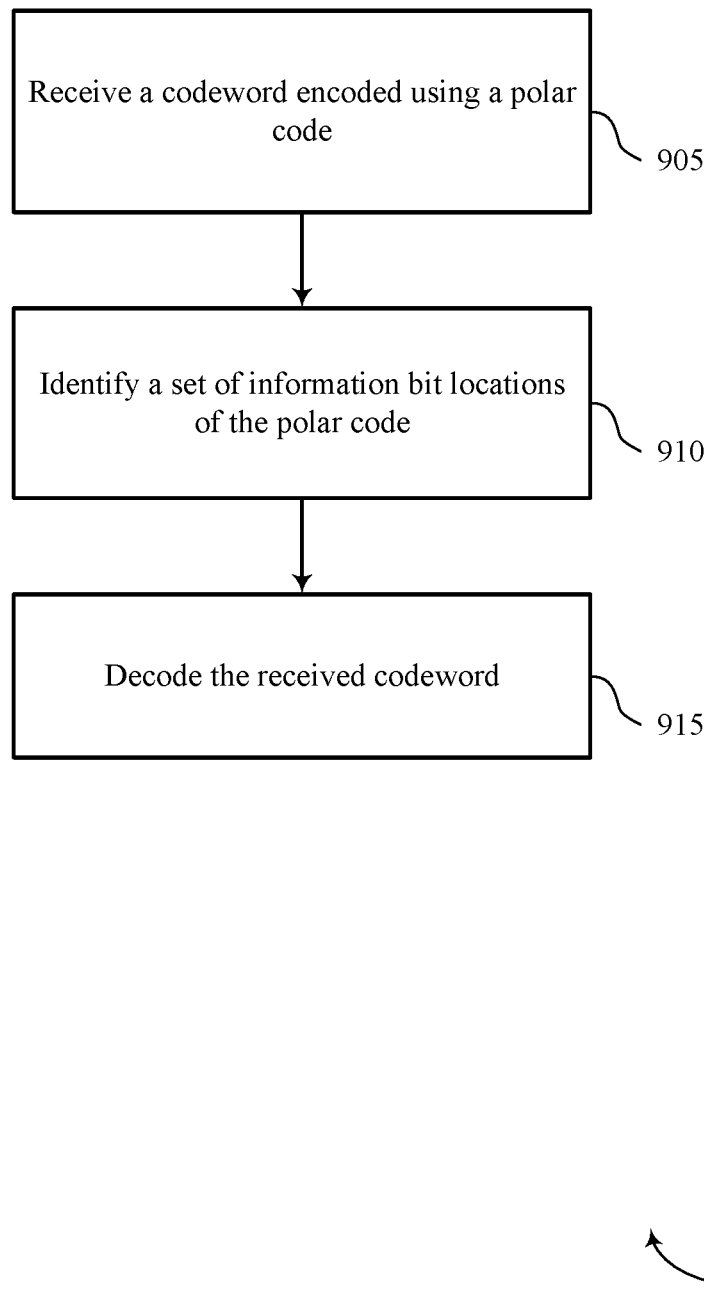
FIGS. 9 and 10 illustrate methods that support a sequence-based polar code description in accordance with various aspects of the present disclosure.

FIG. 9 shows a flowchart illustrating a method 900 that supports a sequence-based polar code description in accordance with various aspects of the present disclosure. The operations of method 900 may be implemented by a UE 115 or base station 105 or its components as described herein. For example, the operations of method 900 may be performed by a communications manager as described with reference to FIGS. 5 and 6. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 905 the UE 115 or base station 105 may receive a codeword over a wireless channel, where the codeword is based at least in part on a plurality of information bits encoded using a polar code. In some cases, the codeword may also be based on a plurality of frozen bits, and the UE 115 or base station 105 may use the frozen bits to, for example, detect errors during decoding. The values of the frozen bits may be denoted by a given value (0, 1, etc.) known to both the encoder (e.g., a transmitting device) and the decoder (e.g., the UE 115 or base station 105). The operations of block 905 may be performed according to the methods described herein. In certain examples, aspects of the operations of block 905 may be performed by a receiver as described with reference to FIGS. 5 and 6.

At block 910 the UE 115 or base station 105 may identify a set of bit locations of the polar code for the plurality of information bits, wherein the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization. The operations of block 910 may be performed according to the methods described herein. In certain examples, aspects of the operations of block 910 may be performed by an information bit location identifier as described with reference to FIGS. 5 and 6.

At block 915 the UE 115 or base station 105 may decode the received codeword according to the polar code to obtain an information bit vector at the set of bit locations. Because the bit locations (or the bit sequence) may be identified based on a binary partition assignment vector for each stage of polarization, a few bits may be used to describe the bit locations in the polar code (e.g., relative to conventional techniques) to allow the UE 115 or base station 105 to retrieve the information bits. The operations of block 915 may be performed according to the methods described herein. In certain examples, aspects of the operations of block 915 may be performed by a decoder as described with reference to FIGS. 5 and 6.

Figure 10:
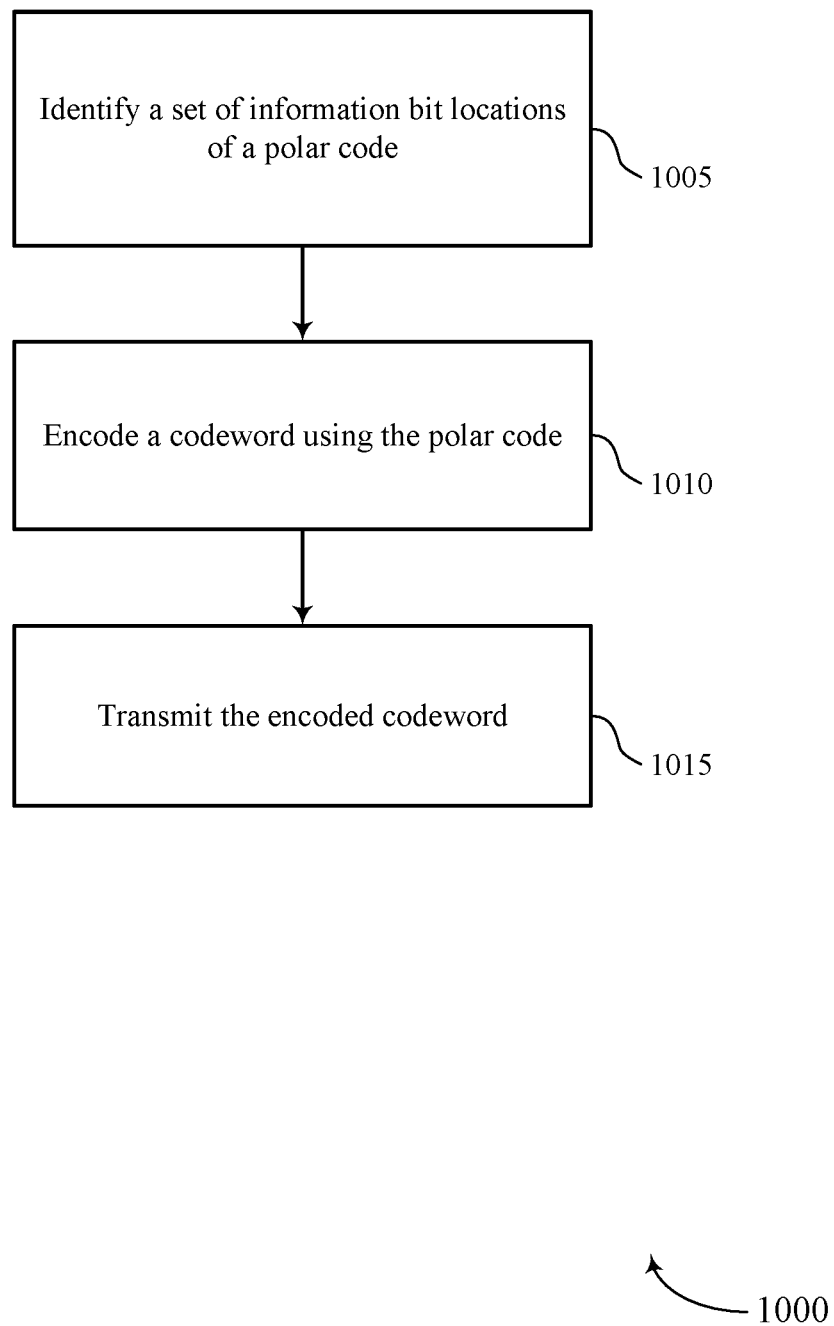

FIG. 10 shows a flowchart illustrating a method 1000 that supports a sequence-based polar code description in accordance with various aspects of the present disclosure. The operations of method 1000 may be implemented by a UE 115 or base station 105 or its components as described herein. For example, the operations of method 1000 may be performed by a communications manager as described with reference to FIGS. 5 and 6. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1005 the UE 115 or base station 105 may identify a set of bit locations of a polar code for a plurality of information bits. The set of bit locations may be determined using a partitioning of bit-channels for at least one stage of polarization of the polar code and assigning information bits of the at least one stage of polarization to partitions based at least in part on a binary partition assignment vector associated with the at least one stage of polarization. The binary partition assignment vector may be used to determine how many of the information bits of a given stage of polarization to assign to a lower sub-partition of bit-channels (e.g., associated with a higher reliability) or an upper sub-partition of bit-channels (e.g., associated with a lower reliability). The size of the binary partition assignment vector for a given stage may be half of the size of the binary partition assignment vector for a previous stage of the recursive partitioning. The recursive partitioning of bit-channels may terminate when each group of bit-channels at a stage of polarization includes a certain number of bit-channels, or after a certain number of stages. Once the recursive partitioning is terminated, a fixed sequence may be used to assign the number of information bits for a given partition to bit-channels of the partition. The fixed sequence may be derived from a polarization weight, a generator weight, a density evolution, a mutual information evaluation, or an extrinsic information transfer chart based evaluation. The operations of block 1005 may be performed according to the methods described herein. In certain examples, aspects of the operations of block 1005 may be performed by an information bit location identifier as described with reference to FIGS. 5 and 6.

At block 1010 the UE 115 or base station 105 may encode the plurality of information bits using the identified set of bit locations of the polar code to obtain a codeword for a transmission over a wireless channel. In some cases, the encoding applies frozen bits to other bit locations of the polar code. A receiving UE or base station may also assign the other bit locations to frozen bits during decoding (e.g., in an SCL process). The values of the frozen bits may be denoted by a given value (0, 1, etc.) known to both the encoder (e.g., the UE 115 or base station 105) and the decoder (e.g., a receiving device). The operations of block 1010 may be performed according to the methods described herein. In certain examples, aspects of the operations of block 1010 may be performed by a encoder as described with reference to FIGS. 5 and 6.

At block 1015 the UE 115 or base station 105 may transmit the encoded codeword over the wireless channel according to the polar code based at least in part on the set of bit locations. Because the bit locations (or the bit sequence) may be identified based on a binary partition assignment vector for each stage of polarization, a few bits may be used to describe the bit locations in the polar code (e.g., relative to conventional techniques) to allow a receiving UE 115 or base station 105 to retrieve the information bits. The operations of block 1015 may be performed according to the methods described herein. In certain examples, aspects of the operations of block 1015 may be performed by a transmitter as described with reference to FIGS. 5 and 6.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNB, gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 of FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
   receiving a codeword over a wireless channel, wherein the codeword is based at least in part on a plurality of information bits encoded using a polar code;
   identifying a set of bit locations of the polar code for the plurality of information bits, wherein the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization; and
   decoding the received codeword according to the polar code to obtain an information bit vector at the set of bit locations.

2. The method of claim 1, wherein the at least one stage of polarization comprises a plurality of stages of polarization, and the assignment of the information bits for each stage of the plurality of stages of polarization comprises recursively partitioning each partition for the each stage into sub-partitions and applying a respective binary partition assignment vector for the each stage to assign a number of information bits for the each partition of the each stage to the sub-partitions.

3. The method of claim 2, wherein a set of bit values of the binary partition assignment vector is based at least in part on a size of the polar code.

4. The method of claim 3, wherein the binary partition assignment vector comprises an equal number of ones and zeros.

5. The method of claim 2, wherein a size of the binary partition assignment vector for a first stage of polarization of the polar code is based at least in part on a size of the polar code.

6. The method of claim 5, wherein a size of the respective binary partition assignment vector for the each stage is half of the respective binary partition assignment vector for a previous stage of the recursive partitioning.

7. The method of claim 2, wherein the recursive partitioning of bit-channels for the plurality of stages of polarization of the polar code is terminated when each partition at a given stage of polarization comprises a predetermined number of bit-channels.

8. The method of claim 7, wherein the assignment of information bits to bit-channels within each partition at the given stage of polarization is based on a fixed sequence.

9. The method of claim 8, wherein the fixed sequence is derived from a polarization weight, a generator weight, a density evolution, a mutual information evaluation, an extrinsic information transfer chart based evaluation, or a combination thereof.

10. The method of claim 1, wherein the information bits of the at least one stage of polarization are assigned to a first partition or a second partition of the at least one stage of polarization based on ordered bit values of the binary partition assignment vector.

11. A method for wireless communication, comprising:
    encoding a codeword using a polar code for a transmission over a wireless channel, wherein the codeword includes an information bit vector comprising a plurality of information bits;
    identifying a set of bit locations of the polar code for the plurality of information bits, wherein the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization; and
    transmitting the encoded codeword over the wireless channel according to the polar code based at least in part on the set of bit locations.

12. The method of claim 11, wherein the at least one stage of polarization comprises a plurality of stages of polarization, and the assignment of the information bits for each stage of the plurality of stages of polarization comprises recursively partitioning each partition for the each stage into sub-partitions and applying a respective binary partition assignment vector for the each stage to assign a number of information bits for the each partition of the each stage to the sub-partitions.

13. The method of claim 12, wherein a set of bit values of the binary partition assignment vector is based at least in part on a size of the polar code.

14. The method of claim 13, wherein the binary partition assignment vector comprises an equal number of ones and zeros.

15. The method of claim 12, wherein a size of the binary partition assignment vector for a first stage of polarization of the polar code is based at least in part on a size of the polar code.

16. The method of claim 15, wherein a size of the respective binary partition assignment vector for the each stage is half of the respective binary partition assignment vector for a previous stage of the recursive partitioning.

17. The method of claim 12, wherein the recursive partitioning of bit-channels for the plurality of stages of polarization of the polar code is terminated when each partition at a given stage of polarization comprises a predetermined number of bit-channels.

18. The method of claim 17, wherein the assignment of information bits to bit-channels within each partition at the given stage of polarization is based on a fixed sequence.

19. The method of claim 18, wherein the fixed sequence is derived from a polarization weight, a generator weight, a density evolution, a mutual information evaluation, an extrinsic information transfer chart based evaluation, or a combination thereof.

20. The method of claim 11, wherein the information bits of the at least one stage of polarization are assigned to a first partition or a second partition of the at least one stage of polarization based on ordered bit values of the binary partition assignment vector.

21. An apparatus for wireless communication, comprising:
- a processor;
- memory in electronic communication with the processor; and
- instructions stored in the memory and operable, when executed by the processor, to cause the apparatus to:
  - receive a codeword over a wireless channel, wherein the codeword is based at least in part on a plurality of information bits encoded using a polar code;
  - identify a set of bit locations of the polar code for the plurality of information bits, wherein the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization; and
  - decode the received codeword according to the polar code to obtain an information bit vector at the set of bit locations.

22. The apparatus of claim 21, wherein the at least one stage of polarization comprises a plurality of stages of polarization, and the assignment of the information bits for each stage of the plurality of stages of polarization comprises recursively partitioning each partition for the each stage into sub-partitions and applying a respective binary partition assignment vector for the each stage to assign a number of information bits for the each partition of the each stage to the sub-partitions.

23. The apparatus of claim 22, wherein a set of bit values of the binary partition assignment vector is based at least in part on a size of the polar code.

24. The apparatus of claim 23, wherein the binary partition assignment vector comprises an equal number of ones and zeros.

25. The apparatus of claim 22, wherein a size of the binary partition assignment vector for a first stage of polarization of the polar code is based at least in part on a size of the polar code.

26. The apparatus of claim 25, wherein a size of the respective binary partition assignment vector for the each stage is half of the respective binary partition assignment vector for a previous stage of the recursive partitioning.

27. The apparatus of claim 22, wherein the recursive partitioning of bit-channels for the plurality of stages of polarization of the polar code is terminated when each partition at a given stage of polarization comprises a predetermined number of bit-channels.

28. The apparatus of claim 27, wherein the assignment of information bits to bit-channels within each partition at the given stage of polarization is based on a fixed sequence.

29. The apparatus of claim 21, wherein the information bits of the at least one stage of polarization are assigned to a first partition or a second partition of the at least one stage of polarization based on ordered bit values of the binary partition assignment vector.

30. An apparatus for wireless communication, comprising:
- a processor;
- memory in electronic communication with the processor; and
- instructions stored in the memory and operable, when executed by the processor, to cause the apparatus to:
  - encode a codeword using a polar code for a transmission over a wireless channel, wherein the codeword includes an information bit vector comprising a plurality of information bits;
  - identify a set of bit locations of the polar code for the plurality of information bits, wherein the set of bit locations is determined based at least in part on a partitioning of bit-channels for at least one stage of polarization of the polar code and assigning information bits of the at least one stage of polarization to partitions based at least in part on a binary partition assignment vector associated with the at least one stage of polarization; and
  - transmit the encoded codeword over the wireless channel according to the polar code based at least in part on the set of bit locations.

* * * * *